US012764400B2

(12) United States Patent
Shimizu et al.

(10) Patent No.: US 12,764,400 B2
(45) Date of Patent: Oct. 13, 2026

(54) HEAT RADIATION STRUCTURE

(71) Applicant: FUJIFILM Corporation, Tokyo (JP)

(72) Inventors: Takayuki Shimizu, Saitama (JP); Masaaki Takagi, Saitama (JP)

(73) Assignee: FUJIFILM Corporation, Tokyo (JP)

( * ) Notice: Subject to any disclaimer, the term of this patent is extended or adjusted under 35 U.S.C. 154(b) by 15 days.

(21) Appl. No.: 19/091,729

(22) Filed: Mar. 26, 2025

(65) Prior Publication Data

US 2025/0254408 A1 Aug. 7, 2025

Related U.S. Application Data

(63) Continuation of application No. PCT/JP2023/034657, filed on Sep. 25, 2023.

(30) Foreign Application Priority Data

Sep. 27, 2022 (JP) ................................ 2022-154094

(51) Int. Cl.

| | |
|---|---|
| ***H04N 23/52*** | (2023.01) |
| ***G03B 17/55*** | (2021.01) |
| ***H04N 23/53*** | (2023.01) |
| ***H10W 40/22*** | (2026.01) |
| ***H10W 40/25*** | (2026.01) |

(52) U.S. Cl.

CPC ............. *H04N 23/52* (2023.01); *G03B 17/55* (2013.01); *H04N 23/53* (2023.01); *H10W 40/22* (2026.01); *H10W 40/258* (2026.01)

(58) Field of Classification Search

CPC ........ H04N 23/52; H04N 23/53; G03B 17/55; G03B 17/02; H10W 40/22; H10W 40/258

See application file for complete search history.

(56) References Cited

U.S. PATENT DOCUMENTS

2006/0056049 A1* 3/2006 Tokiwa ................ H04N 23/663
348/E5.025
2010/0245662 A1 9/2010 Ishikawa
(Continued)

FOREIGN PATENT DOCUMENTS

| | | |
|---|---|---|
| CN | 206947326 | 1/2018 |
| CN | 209590500 | 11/2019 |
| JP | 5225171 | 7/2013 |

(Continued)

OTHER PUBLICATIONS

"International Search Report (Form PCT/ISA/210) of PCT/JP2023/034657", mailed on Dec. 5, 2023, with English translation thereof, pp. 1-5.

(Continued)

*Primary Examiner* — Albert H Cutler

(74) *Attorney, Agent, or Firm* — JCIPRNET

(57) ABSTRACT

The heat radiation structure includes an imaging element, a laminate that is disposed in a Z1 direction, which is a direction toward a side opposite to an imaging surface, with respect to the imaging element, a sheet metal member that includes a through-hole, a rear case that is disposed on a Z1 direction side with respect to the sheet metal member, and a first heat conduction member that comes into contact with the laminate and that comes into contact with the rear case through the through-hole. The laminate is a heat source member.

19 Claims, 7 Drawing Sheets

(56) References Cited

U.S. PATENT DOCUMENTS

| | | | | |
|---|---|---|---|---|
| 2013/0148016 | A1* | 6/2013 | Oh | H04N 23/54<br>348/E5.026 |
| 2024/0107138 | A1* | 3/2024 | Chennupati | H05K 7/20409 |

FOREIGN PATENT DOCUMENTS

| | | |
|---|---|---|
| JP | 2020030393 | 2/2020 |
| WO | 2021182344 | 9/2021 |

OTHER PUBLICATIONS

"International Preliminary Report On Patentability (Form PCT/IPEA/409) of PCT/JP2023/034657", mailed on Mar. 27, 2025, with English translation thereof, pp. 1-6.

* cited by examiner

HEAT RADIATION STRUCTURE

CROSS-REFERENCE TO RELATED APPLICATIONS

This application is a Continuation of PCT International Application No. PCT/JP2023/034657 filed on 25 Sep. 2023, which claims priority under 35 U.S.C § 119(a) to Japanese Patent Application No. 2022-154094 filed on 27 Sep. 2022. The above application is hereby expressly incorporated by reference, in its entirety, into the present application.

BACKGROUND OF THE INVENTION

1. Field of the Invention

The present invention relates to a heat radiation structure.

2. Description of the Related Art

An imaging apparatus described in JP5225171B (corresponding to US2010/0245662A1) includes a photoelectric conversion element module unit, an imaging lens barrel unit, a heat radiation member, and a heat conduction member. The photoelectric conversion element module unit is attached to the imaging lens barrel unit. The heat conduction member is disposed between a center portion of a rear surface of a photoelectric conversion element package and the heat radiation member disposed to face the center portion. In such a manner, a heat conduction path, through which heat generated at the photoelectric conversion element package is radiated to a heat radiation member side via the heat conduction member, is configured.

An optical unit described in JP2020-30393A includes an optical element, an imaging element, a movable body, and a fixed body. The movable body supports the optical element and the imaging element. A heat conduction member that has elasticity or viscoelasticity and that connects the movable body and the fixed body to each other is provided between the movable body and the fixed body. The heat conduction member transmits heat generated at the imaging element to the fixed body.

SUMMARY OF THE INVENTION

One embodiment according to the present disclosed technology provides a heat radiation structure with which it is possible to reduce a dimension in a thickness direction and to reliably radiate heat generated at a heat source member.

In order to achieve the above-described object, a heat radiation structure according to an aspect of the present invention includes an imaging element, a heat source member, a first metal member, a second metal member, and a first heat conduction member. The heat source member is disposed in a first direction of the imaging element. The first metal member includes a through-hole. The second metal member is disposed on a first direction side with respect to the first metal member. The first heat conduction member comes into contact with the heat source member and comes into contact with the second metal member through the through-hole.

It is preferable that the first direction is a direction toward a side opposite to an imaging surface of the imaging element. It is preferable that the first heat conduction member comes into contact with the first metal member with a change in shape. It is preferable that the change in shape is elastic deformation.

It is preferable that at least a portion of a contact surface of the first metal member that comes into contact with the first heat conduction member with the elastic deformation is a metal. It is preferable that at least a portion of a surface of the first metal member that faces the second metal member is a metal.

It is preferable that a first thermal conductivity, which is a thermal conductivity of the first metal member, is larger than a second thermal conductivity, which is a thermal conductivity of the second metal member. It is preferable that the first thermal conductivity and the second thermal conductivity are thermal conductivities of a metal. It is preferable that the first thermal conductivity and the second thermal conductivity are thermal conductivities of surfaces of the first metal member and the second metal member that face each other, respectively.

It is preferable that the first metal member is a material including aluminum and the second metal member is a material including magnesium. It is preferable that at least a portion of a surface of the first metal member that faces the second metal member is a material including aluminum and at least a portion of a surface of the second metal member that faces the first metal member is a material including magnesium.

It is preferable that the heat radiation structure further includes a first electronic member to which heat of the heat source member is transferred and a second heat conduction member that is disposed to come into contact with the first electronic member and the second heat conduction member is disposed in a vicinity of the through-hole and comes into contact with the first metal member. It is preferable that at least a portion of a contact surface of the first metal member that comes into contact with the second heat conduction member is a metal. It is preferable that a plurality of second heat conduction members are disposed.

It is preferable that the heat source member includes at least a large-scale integrated circuit. It is preferable that the heat source member includes the large-scale integrated circuit, an intermediate substrate and a semiconductor memory, the large-scale integrated circuit is laminated on one surface of the intermediate substrate, and the semiconductor memory is laminated on the other surface of the intermediate substrate.

It is preferable that a thickness of a portion of the second metal member that comes into contact with the first heat conduction member is larger than a thickness of a portion of the second metal member that does not come into contact with the first heat conduction member. It is preferable that the first heat conduction member and the second heat conduction member are gel-like members.

It is preferable that the heat radiation structure further includes a display that is disposed on the first direction side with respect to the second metal member and the first heat conduction member is disposed in an inside of an area of the display. It is preferable that at least a portion of the through-hole is disposed in the inside of the area of the display. It is preferable that the inside of the area is the inside of the area at a time when the display is seen in the first direction in a see-through manner.

Figure 6:
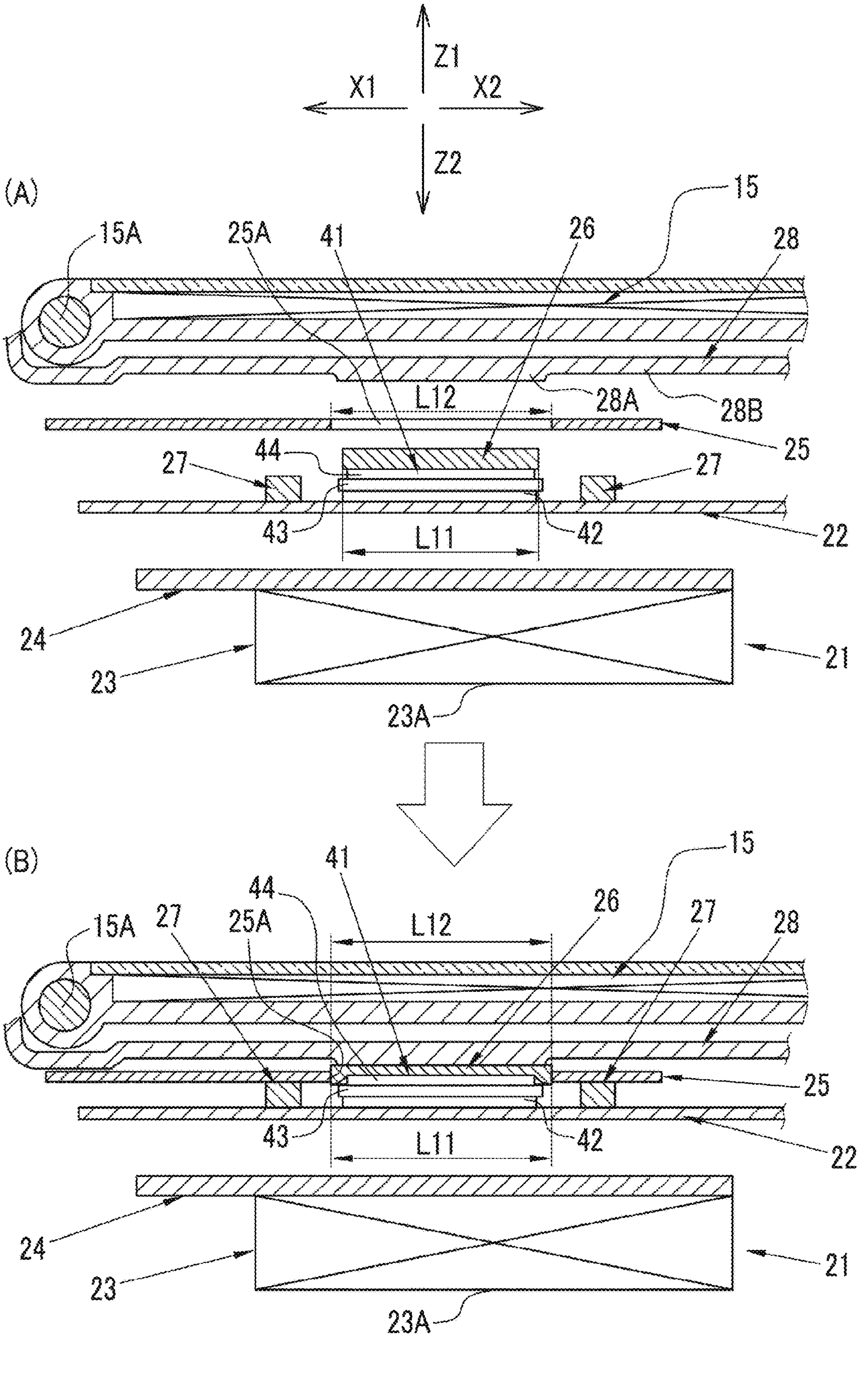

(A) of FIG. 6 is an explanatory view for description of a state before deformation of a first heat conduction member interposed between a heat source member and a second metal member and (B) of FIG. 6 is an explanatory view for description of a state after the deformation.

Figure 7:
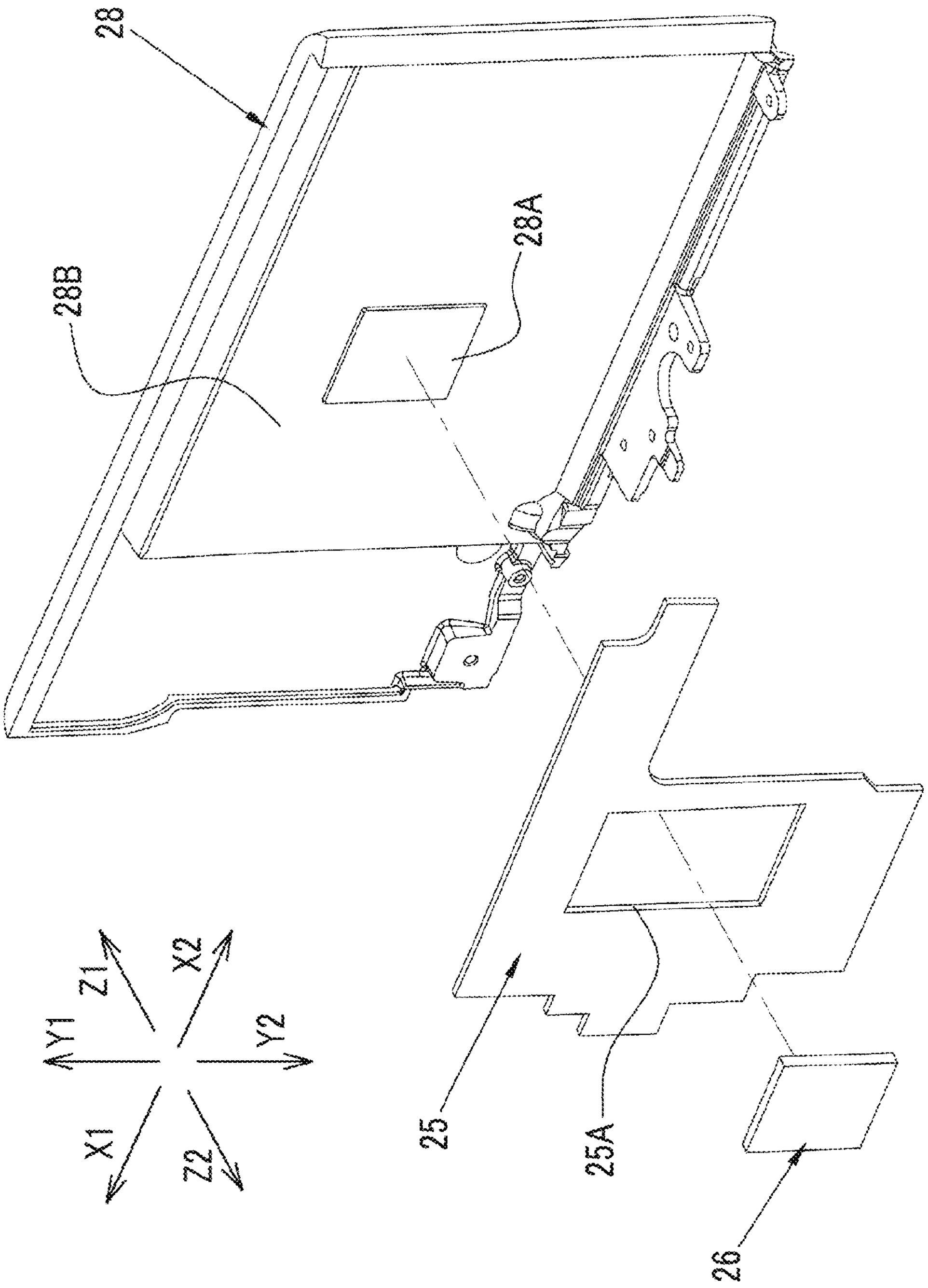

FIG. 7 is a perspective view showing a positional relationship between the first heat conduction member, a first metal member, and the second metal member.

DESCRIPTION OF THE PREFERRED EMBODIMENTS

Figure 1:
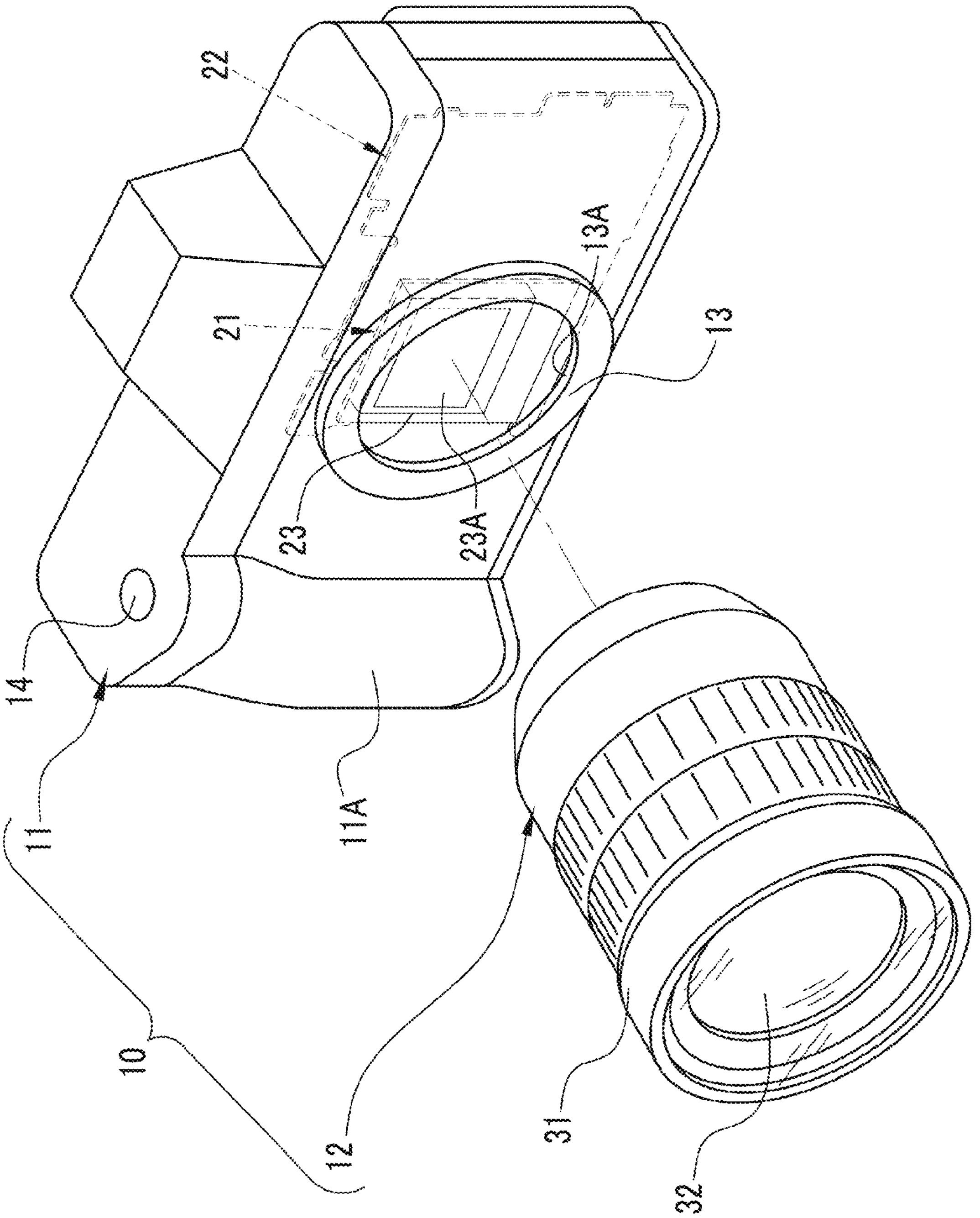
FIG. 1 is a front perspective view of an imaging apparatus.

A digital camera 10 includes a camera body 11 and an interchangeable lens barrel 12, as shown in FIG. 1. A lens mount 13 and a release switch 14 are provided at a front surface of the camera body 11. The lens mount 13 includes a circular imaging aperture 13A. The lens barrel 12 is attachably and detachably attached to the lens mount 13. The digital camera 10 is an example of an imaging apparatus having a heat radiation structure according to an embodiment of the present invention.

Figure 2:
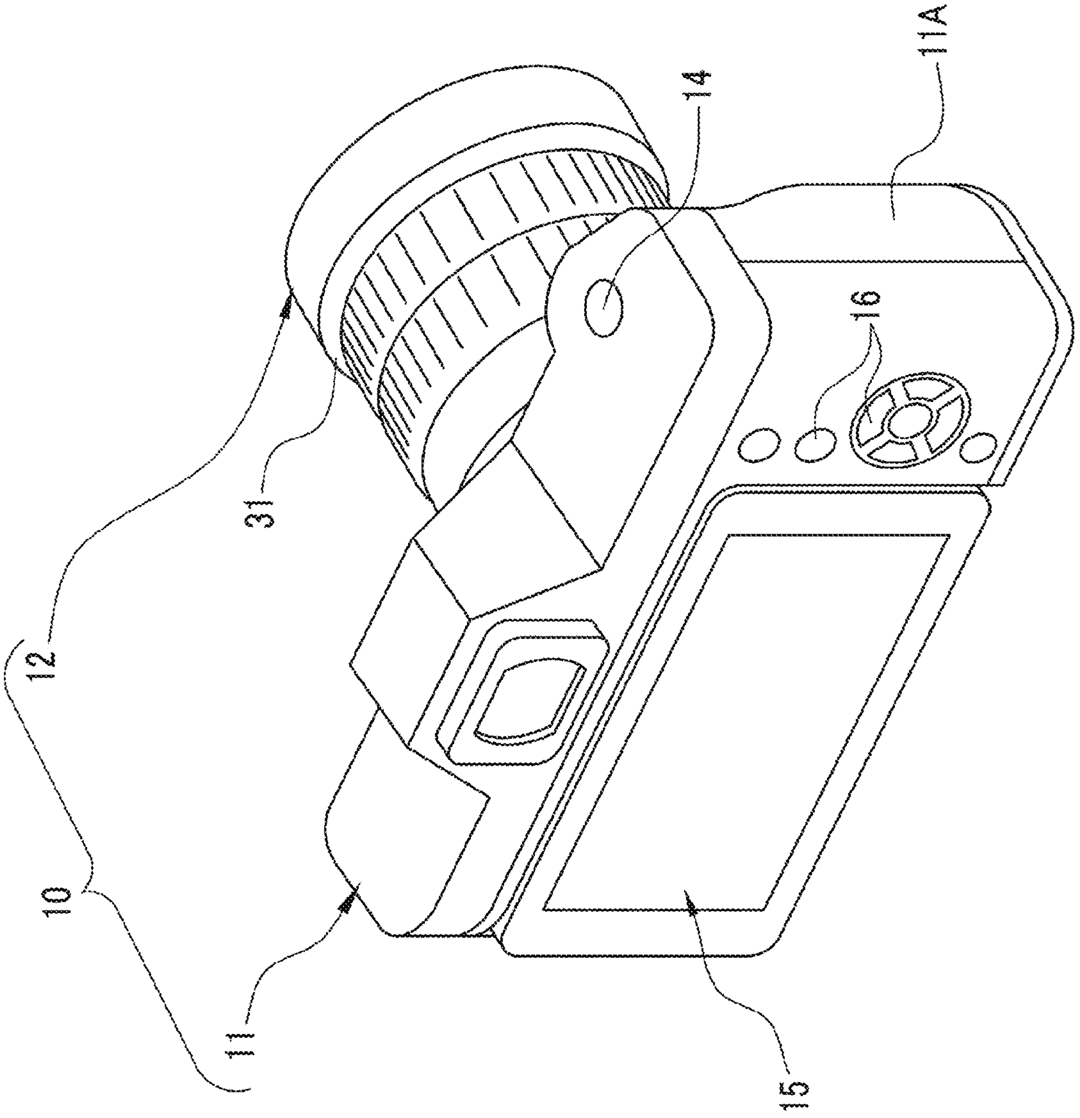
FIG. 2 is a rear perspective view of the imaging apparatus.

As shown in FIG. 2, the camera body 11 includes a display 15, operation buttons 16, and the like that are provided on a rear surface. The display 15 is a liquid crystal display (LCD), an organic electroluminescent display (OELD), or the like. The display 15 is used for the displaying of a live view image, the displaying of a captured image, the displaying of a setting menu, and the like. In addition, the camera body 11 includes a grip portion 11A.

Figure 3:
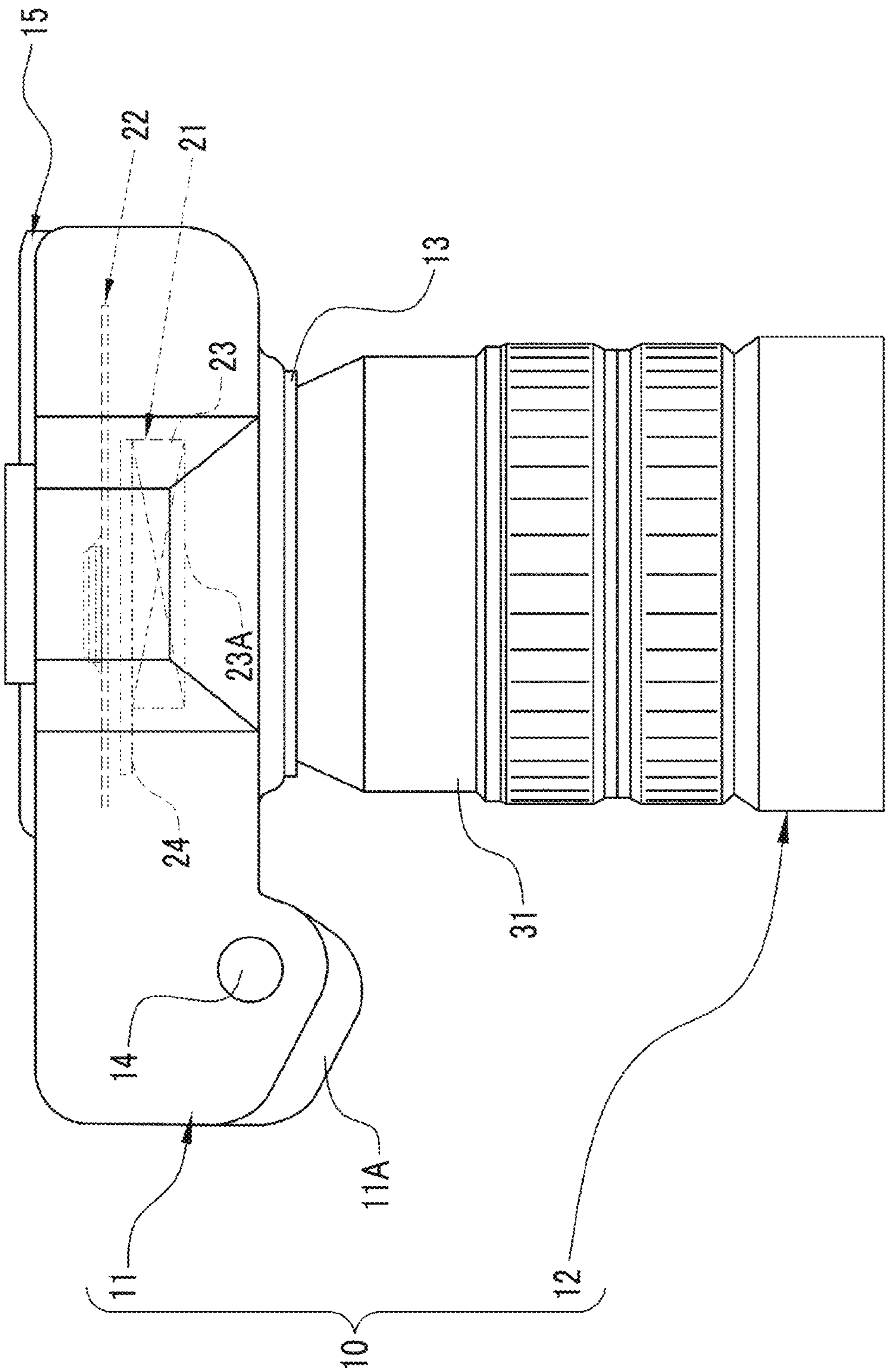
FIG. 3 is a plan view of the imaging apparatus.

As shown in FIG. 3, an imaging element unit 21 and a main board 22 are built into the camera body 11. The main board 22 corresponds to a first electronic member in the claims. The imaging element unit 21 includes an imaging element 23 and an imaging element substrate 24. The imaging element 23 is mounted onto the imaging element substrate 24. Note that the imaging element unit 21 is also provided with an anti-vibration device for correction of blurry subject light that is caused by vibration applied to the camera body 11, a flexible printed substrate used for connection to the main board 22, and the like. However, the anti-vibration device, the flexible printed substrate, and the like are not shown. The imaging element unit 21 is attached to a front case 29 by being fastened with, for example, a screw member (not shown).

The imaging element 23 is, for example, a complementary metal-oxide semiconductor (CMOS) image sensor, a charge-coupled device (CCD) image sensor, or an organic thin film imaging element. The imaging element 23 includes a rectangular imaging surface 23A used to image a subject. The imaging surface 23A receives subject light indicating the subject. As is well known, on the imaging surface 23A, pixels that photoelectrically convert the received subject light and output electric signals are arranged in a two-dimensional manner. The entire imaging surface 23A is exposed to the outside through the imaging aperture 13A.

The imaging element unit 21 and the main board 22 are connected to each other by the flexible printed substrate (not shown). The lens barrel 12 includes a lens barrel body 31, an imaging optical system 32 (refer to FIG. 1), and the like. The lens barrel body 31 has a cylindrical shape, holds the imaging optical system 32 therein, and includes a lens mount (not shown) provided at a rear end thereof. The imaging optical system 32 forms an image of subject light on the imaging element 23 in a case where the lens barrel 12 is mounted onto the camera body 11.

Figure 4:
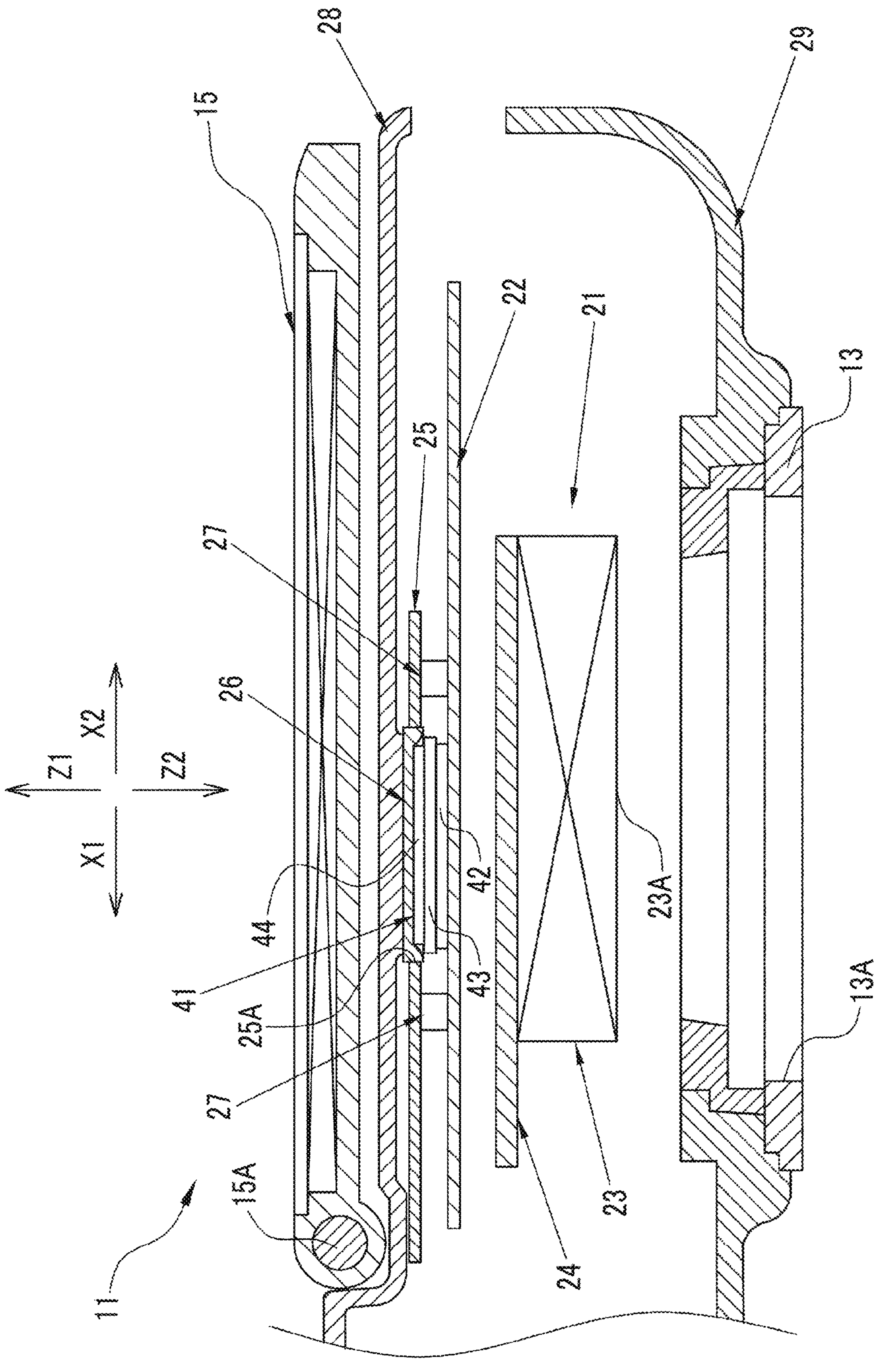
FIG. 4 is a cross-sectional view of a main part of the imaging apparatus.

As shown in FIG. 4, the camera body 11 includes a sheet metal member 25, a first heat conduction member 26, second heat conduction members 27, a rear case 28, and the front case 29 in addition to the imaging element unit 21, the main board 22, and the display 15. The sheet metal member 25 is a first metal member in the claims, and the rear case 28 is a second metal member in the claims.

The rear case 28 and the front case 29 are bonded to a top (top surface) case, a bottom (bottom surface) case, a lid member (not shown), and the like, and constitute an exterior case of the camera body 11. The rear case 28 and the front case 29 accommodate the imaging element unit 21, the main board 22, the sheet metal member 25, the first heat conduction member 26, and the second heat conduction members 27.

The main board 22 is provided with a laminate 41 serving as a heat source member. Accordingly, heat of the laminate 41 is transmitted to the main board 22. The laminate 41 includes a large scale integration (LSI) 42. Specifically, the laminate 41 includes the LSI 42, an intermediate substrate 43, and a semiconductor memory 44. The LSI 42 is laminated on one surface of the intermediate substrate 43 and the semiconductor memory 44 is laminated on the other surface of the intermediate substrate 43.

The LSI 42 functions as a central processing unit (CPU) that executes software (a program) to perform various types of processes. The LSI 42 controls the operation of each unit of the digital camera 10 including the imaging element 23.

For example, a dynamic random access memory (DRAM) is used as the semiconductor memory 44. The semiconductor memory 44 is electrically connected to the LSI 42 and is used, for example, as a main memory in which a program is stored in a case where the LSI 42 operates.

The laminate 41 is disposed in a Z1 direction (a first direction) with respect to the imaging element 23. In addition, a side of the laminate 41 on which the LSI 42 is positioned is fixed to the main board 22 and a side of the laminate 41 on which the semiconductor memory 44 is positioned is positioned on the Z1 direction side with respect to the LSI 42.

A direction toward the imaging surface 23A with respect to the imaging element 23 is a Z2 direction and the Z1 direction is a direction opposite to the Z2 direction with respect to the imaging element 23. The main board 22 is disposed on the Z1 direction side with respect to the imaging element unit 21 including the imaging element 23, and the laminate 41 is provided on the Z1 direction side with respect to the main board 22. In addition, a Y1 direction and a Y2 direction (refer to FIG. 5) are directions orthogonal to the Z1 direction and the Z2 direction and in the present embodiment, the Y1 direction and the Y2 direction are parallel to the top-bottom direction (a vertical direction) of the digital camera 10. In addition, an X1 direction and an X2 direction are directions orthogonal to the Z1 direction, the Z2 direction, the Y1 direction, and the Y2 direction and in the present embodiment, the X1 direction and the X2 direction are lateral directions of the digital camera 10. Note that in the present specification, the term "orthogonal" includes not only the meaning of perfect orthogonality but also the meaning of substantial orthogonality including errors allowed in design and manufacturing. Additionally, the term "parallel" includes not only the meaning of perfect parallelism but also the meaning of substantial parallelism including errors allowed in design and manufacturing.

The sheet metal member 25 is positioned on the Z1 direction side with respect to the main board 22. At least a portion of the sheet metal member 25 is a metal, and the entire sheet metal member 25 may be a metal. In the present embodiment, the entire sheet metal member 25 is a metal and is formed in a plate-like shape. The metal used as the material of the sheet metal member 25 includes, for example, aluminum. Note that the sheet metal member 25 is preferably a material having a high thermal conductivity, and may be a material including copper in a case where a substance other than aluminum is to be included and an increase in specific gravity is allowed. A rectangular through-hole 25A is formed in the sheet metal member 25. The through-hole 25A is formed at a position corresponding to the laminate 41.

The rear case 28 is positioned on the Z1 direction side with respect to the sheet metal member 25. At least a portion of the rear case 28 is a metal, and the entire rear case 28 may be a metal. In the present embodiment, the entire rear case 28 is a metal, the area of the rear case 28 is larger than the area of the sheet metal member 25 as seen in a direction parallel to the Z1 direction, and the volume of the rear case 28 is larger than the volume of the sheet metal member 25. The metal used as the material of the rear case 28 includes, for example, magnesium. A ratio of the area of the sheet metal member 25 to the area of the rear case 28 as seen in the direction parallel to the Z1 direction is, for example, 20%.

A first thermal conductivity, which is the thermal conductivity of the sheet metal member 25, is larger than a second thermal conductivity, which is the thermal conductivity of the rear case 28. A case where a metal used as the material of the sheet metal member 25 contains aluminum and a metal used as the material of the rear case 28 includes magnesium as described above corresponds to a case where such a relationship between the thermal conductivities is satisfied. Note that the first thermal conductivity and the second thermal conductivity mentioned herein are the thermal conductivities of metals used as the materials of the sheet metal member 25 and the rear case 28.

Figure 5:
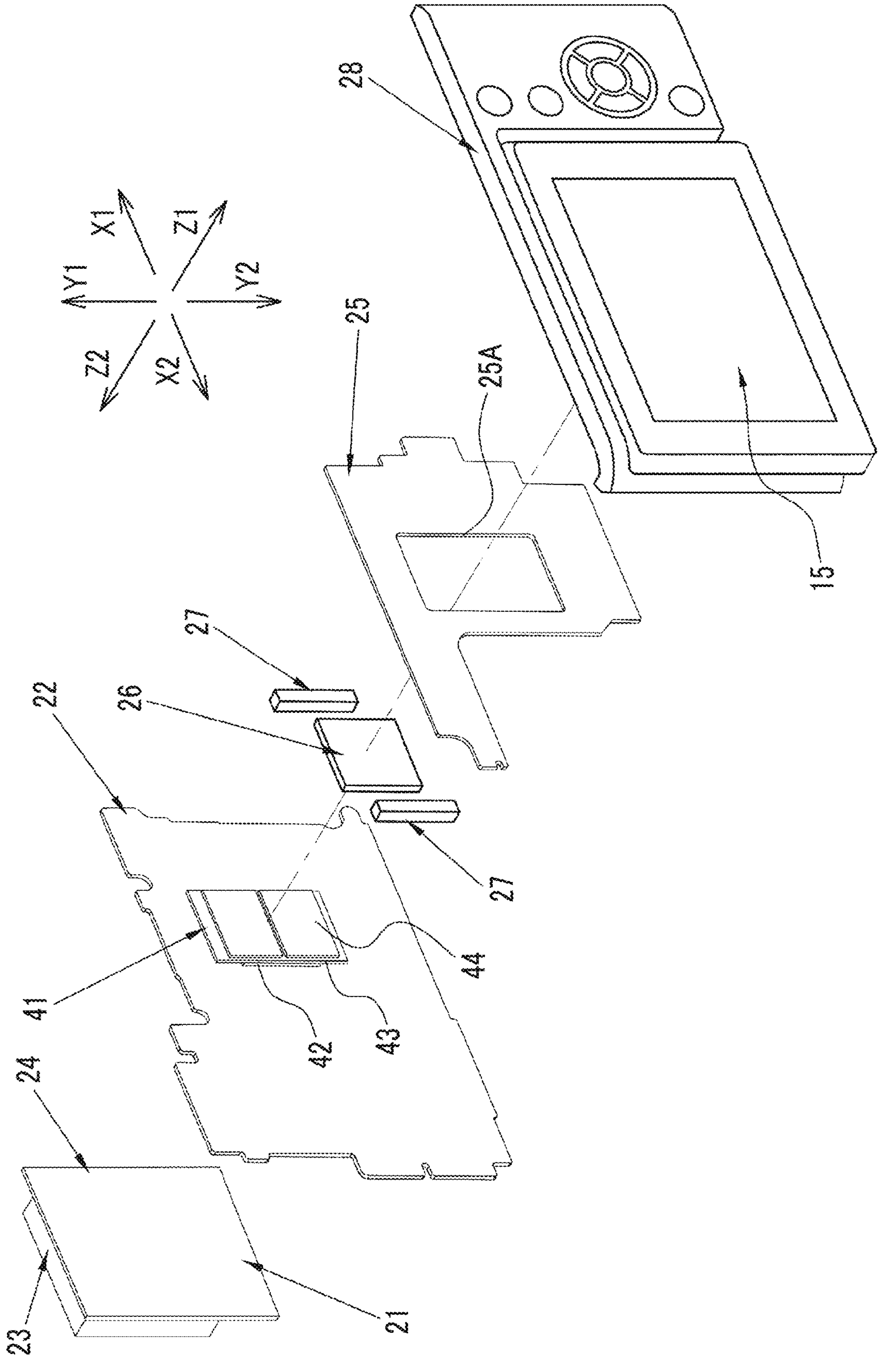
FIG. 5 is an exploded perspective view of the vicinity of a heat radiation structure.

As shown in FIG. 5, the first heat conduction member 26 is disposed at a position at which the first heat conduction member 26 comes into contact with the laminate 41. The first heat conduction member 26 comes into contact with the rear case 28 through the through-hole 25A. Furthermore, the first heat conduction member 26 comes into contact with the sheet metal member 25 with a change in shape. Specifically, as described below, the first heat conduction member 26 comes into contact with the sheet metal member 25 with elastic deformation which is the change in shape. The first heat conduction member 26 and the second heat conduction members 27 are gel-like members that thermally conduct heat generated by a heat source member (a member that generates heat like the laminate 41) to a heat radiation member (a member having a large volume like the rear case 28 and the sheet metal member 25), and for example, thermal interface materials (TIM) are used therefor.

The second heat conduction members 27 are disposed to come into contact with the main board 22. In the present embodiment, two second heat conduction members 27 are provided. Note that the present invention is not limited thereto and the number of the second heat conduction members 27 may be one or three or more. The two second heat conduction members 27 are disposed in the vicinity of the through-hole 25A and come into contact with the sheet metal member 25. Specifically, the two second heat conduction members 27 are disposed at positions that are different from each other in the X1 direction and the X2 direction with the through-hole 25A interposed therebetween. In the digital camera 10, there is a spatial margin in the X1 direction and the X2 direction because of the layout of components and thus it is easy to dispose the second heat conduction members 27 at positions that are different from each other in the X1 direction and the X2 direction.

As shown in (A) of FIG. 6, in a state before a change in shape of the first heat conduction member 26, that is, in a state before elastic deformation, since dimensions of the first heat conduction member 26 in the X1 direction and the X2 direction and/or the Y1 direction and the Y2 direction are smaller than dimensions of the through-hole 25A in the X1 direction and the X2 direction and/or the Y1 direction and the Y2 direction, the first heat conduction member 26 is not in contact with the sheet metal member 25. Note that a dimension L11 is a dimension of the first heat conduction member 26 in the X1 direction and the X2 direction, and a dimension L12 is a dimension of the through-hole 25A in the X1 direction and the X2 direction. In the state shown in (A) of FIG. 6, the dimension L11 of the first heat conduction member 26 is smaller than the dimension L12 of the through-hole 25A.

In a case where the camera body 11 is assembled, for example, the sheet metal member 25 is fixed to the rear case 28 by being fitted or fastened and the main board 22 is attached to the rear case 28 by being fastened. In a case where such components are bonded to each other, the first heat conduction member 26 is interposed between the laminate 41 and the rear case 28 through the through-hole 25A.

As shown in (B) of FIG. 6, the first heat conduction member 26 is elastically deformed while being interposed between the laminate 41 and the rear case 28 through the through-hole 25A. Specifically, the first heat conduction member 26 enters a state of being compressed in the Z1 direction and the Z2 direction. In a case where the first heat conduction member 26 having elasticity is compressed in the Z1 direction and the Z2 direction, the first heat conduction member 26 enters a state of being expanded in the X1 direction and the X2 direction and/or the Y1 direction and the Y2 direction at the same time. Therefore, in a state after the change in shape of the first heat conduction member 26, that is, in a state after the elastic deformation, the dimensions of the first heat conduction member 26 in the X1 direction and the X2 direction and/or the Y1 direction and the Y2 direction are larger than the dimensions of the through-hole 25A in the X1 direction and the X2 direction and/or the Y1 direction and the Y2 direction and the first heat conduction member 26 is in contact with the sheet metal member 25. In a state shown in (B) of FIG. 6, the dimension L11 of the first heat conduction member 26 is equal to the dimension L12 of the through-hole 25A, and both side ends of the first heat conduction member 26 are in contact with the through-hole 25A.

In addition, the display 15 is attached to the rear case 28. The display 15 is rotationally connected to the rear case 28 via a rotational movement shaft 15A. The display 15 is disposed on the Z1 direction side with respect to the rear case 28. The first heat conduction member 26 is disposed in the inside of an area of the display 15. The inside of the area of the display 15 means the inside of the area in a case where the display 15 is seen in the Z1 direction in a see-through manner. In addition, at least a portion of the through-hole 25A is disposed in the inside of the area of the display 15. In the present embodiment, the entire through-hole 25A is disposed in the inside of the area of the display 15.

As shown in FIG. 7, the thickness of a portion 28A (refer to (A) of FIG. 6) of the rear case 28 that comes into contact with the first heat conduction member 26 is larger than the thickness of a portion 28B (refer to (A) of FIG. 6) of the rear case 28 that does not come into contact with the first heat conduction member 26. Note that the thicknesses mentioned herein are dimensions of the rear case 28 in the Z1 direction and the Z2 direction. A metal constituting the rear case 28 has a thermal conductivity higher than the thermal conductivity of the first heat conduction member 26. The thickness of the portion 28A that comes into contact with the first heat conduction member 26 is, for example, 1.2 mm, and the thickness of the portion 28B that does not come into contact with the first heat conduction member 26 is, for example, 0.8 mm.

Next, an action of the digital camera 10 according to the present embodiment will be described. In a case where the digital camera 10 is used, that is, in a case where various operations such as imaging and recording are performed, the laminate 41 including the LSI 42 functioning as a CPU, the semiconductor memory 44 functioning as a main memory, and the intermediate substrate 43 on which the LSI 42 and the semiconductor memory 44 are laminated generates heat. In the present embodiment, as described above, the first heat conduction member 26 is disposed at a position at which the first heat conduction member 26 comes into contact with the laminate 41 and comes into contact with the rear case 28 through the through-hole 25A of the sheet metal member 25. Accordingly, with the digital camera 10, it is possible to reduce a dimension in a thickness direction and to reliably radiate heat generated at the laminate 41.

In a case where a surface of a heat conduction member and a surface of a sheet metal member come into contact with each other not through a through-hole, there is an increase in dimension of an imaging apparatus in a thickness direction corresponding to the thickness of the sheet metal member and the thickness of the heat conduction member. However, in the present embodiment, since the first heat conduction member 26 passes through the through-hole 25A, it is possible to reduce the dimension in the thickness direction, to achieve compactness, and to reliably thermally conduct heat generated at the laminate 41 to the rear case 28. Since heat of the laminate 41 is thermally conducted to the rear case 28 of which the area and the volume are large in this manner, a heat spot (a portion where a temperature is high at only one place) is less likely to be generated and it is possible to reliably radiate heat generated at the laminate 41.

In addition, in the digital camera 10, the second heat conduction members 27 come into contact with the main board 22, are disposed in the vicinity of the through-hole 25A, and come into contact with the sheet metal member 25. Accordingly, heat of the laminate 41 is transmitted to the second heat conduction members 27 through the main board 22 and the second heat conduction members 27 can thermally conduct the heat to the sheet metal member 25. Since the heat of the laminate 41 is thermally conducted to the sheet metal member 25 in this manner, it is possible to further reliably radiate heat generated at the laminate 41. In addition, since the sheet metal member 25 and the rear case 28 include metals, the heat is also transmitted from the sheet metal member 25 to the rear case 28.

In addition, regarding the rear case 28, the thickness of the portion 28A that comes into contact with the first heat conduction member 26 is larger than the thickness of the portion 28B that does not come into contact with the first heat conduction member 26 and the metal constituting the rear case 28 has a thermal conductivity higher than the thermal conductivity of the first heat conduction member 26. Accordingly, heat is more easily conducted since the portion 28A of the rear case 28, which is thick, and the first heat conduction member 26 come into contact with each other. Therefore, it is possible to further reliably radiate heat generated at the laminate 41.

In addition, the display 15 is disposed on the Z1 direction side with respect to the rear case 28, and the first heat conduction member 26 is disposed in the inside of the area of the display 15. Accordingly, heat generated at the laminate 41 is transmitted to the first heat conduction member 26, the rear case 28, and the display 15 and thus it is possible to further reliably radiate heat generated at the laminate 41.

In the above-described embodiment, a case where the entire sheet metal member 25 is a metal has been described as an example. However, it is preferable that a surface of the sheet metal member 25 that comes into contact with the first heat conduction member 26 due to compression, that is, at least a portion of an inner surface of the through-hole 25A is a metal. In this case, the same effects as those of the above-described embodiment can be achieved. That is, it is possible to reliably radiate heat generated at the laminate 41. In addition, it is preferable that at least a portion of the sheet metal member 25 that comes into contact with the second heat conduction members 27 is a metal. In addition, the present invention is not limited thereto and it is preferable that at least a portion of a surface of the sheet metal member 25 that faces the rear case 28 is a metal and that at least a portion of a surface of the rear case 28 that faces the sheet metal member 25 is a metal. In addition, in a case where a portion of the sheet metal member 25 and a portion of the rear case 28 are metals, the first thermal conductivity and the second thermal conductivity as described above are thermal conductivities of surfaces the sheet metal member 25 and the rear case 28 that face each other, respectively. In addition, in a case where a portion of the sheet metal member 25 and a portion of the rear case 28 are metals, a portion other than the metals may be, for example, a component including a resin material.

In addition, in a case where a portion of the sheet metal member 25 is a material including aluminum, it is preferable that at least a portion of a surface of the sheet metal member 25 that faces the rear case 28 is a material including aluminum. In addition, in a case where a portion of the rear case 28 is a material including magnesium, it is preferable that at least a portion of a surface of the rear case 28 that faces the sheet metal member 25 is a material including magnesium.

In addition, in the above-described embodiment, a plurality of the second heat conduction members 27 are disposed at positions that are different from each other in the X1 direction and the X2 direction (the lateral directions). However, the present invention is not limited thereto and the second heat conduction members 27 may be disposed are disposed at positions that are different from each other in the Y1 direction and the Y2 direction (top-bottom directions).

In each of the above-described embodiments, the LSI 42 has been described as an example of a processor that controls the operation of a camera body. However, the processor as a hardware structure of a processing unit performing various processes like the LSI 42 is not limited thereto. A graphical processing unit (GPU), a programmable logic device (PLD) that is a processor of which the circuit configuration can be changed after manufacture, such as a field programmable gate array (FPGA), a dedicated electrical circuit that is a processor having a circuit configuration designed exclusively to perform various processes, and the like are included in various processors instead of or in addition to a CPU.

One processing unit may be composed of one of these various processors or a combination of two or more processors of the same type or different types (for example, a combination of a plurality of FPGAs, a combination of a CPU and an FPGA, a combination of a CPU and a GPU, or the like). In addition, a plurality of processing units may be composed of one processor. As examples of a configuration in which a plurality of processing units are composed of one processor, firstly, there is a configuration in which one processor is composed of a combination of one or more CPUs and software and the processor functions as a plurality of processing units as represented by a computer such as a client, a server, or the like. Secondly, as represented by a system-on-chip (SoC), there is a configuration in which a processor that realizes, with one integrated circuit (IC) chip, the functions of the entire system including a plurality of processing units is used. As described above, various processing units are configured by using one or more of the above-described various processors as the hardware structure.

The heat source member is not limited to the laminate 41 described as an example in the above-described embodiment, and may be a single LSI without a semiconductor memory and an intermediate substrate, or may be various processors as described above.

Furthermore, the hardware structure of the various processors is, more specifically, an electric circuit (circuitry) in which circuit elements such as semiconductor elements are combined with each other.

Note that the present invention can be applied to an imaging apparatus, such as a smartphone or a video camera, in addition to the digital camera.

EXPLANATION OF REFERENCES

10: digital camera
11: camera body
11A: grip portion
12: lens barrel
13: lens mount
13A: imaging aperture
14: release switch
15: display
15A: rotational movement shaft
16: operation button
21: imaging element unit
22: main board
23: imaging element
23A: imaging surface
24: imaging element substrate
25: sheet metal member
25A: through-hole
26: first heat conduction member
27: second heat conduction member
28: rear cover
28A: portion
28B: portion
29: front cover
31: lens barrel body
32: imaging optical system
41: laminate
42: large scale integration (LSI)
43: intermediate substrate
44: semiconductor memory
L11: dimension
L12: dimension

What is claimed is:

1. A heat radiation structure comprising:
an imaging element;
a heat source member that is disposed in a first direction of the imaging element;
a first metal member that includes a through-hole;
a second metal member that is disposed on a first direction side with respect to the first metal member; and
a first heat conduction member that comes into contact with the heat source member and that comes into contact with the second metal member through the through-hole,
wherein the first heat conduction member comes into contact with the first metal member with a change in shape,
an area of the second metal member is larger than an area of the first metal member as viewed in a direction parallel to the first direction, and a volume of the second metal member is larger than a volume of the first metal member, and
a first thermal conductivity, which is a thermal conductivity of the first metal member, is larger than a second thermal conductivity, which is a thermal conductivity of the second metal member.

2. The heat radiation structure according to claim 1,
wherein the first direction is a direction toward a side opposite to an imaging surface of the imaging element.

3. The heat radiation structure according to claim 1,
wherein the change in shape is elastic deformation.

4. The heat radiation structure according to claim 3,
wherein at least a portion of a contact surface of the first metal member that comes into contact with the first heat conduction member with the elastic deformation is a metal.

5. The heat radiation structure according to claim 4,
wherein at least a portion of a surface of the first metal member that faces the second metal member is a metal.

6. The heat radiation structure according to claim 1,
wherein the first thermal conductivity and the second thermal conductivity are thermal conductivities of a metal.

7. The heat radiation structure according to claim 1,
wherein the first thermal conductivity and the second thermal conductivity are thermal conductivities of surfaces of the first metal member and the second metal member that face each other, respectively.

8. The heat radiation structure according to claim 1,
wherein the first metal member is a material including aluminum, and
the second metal member is a material including magnesium.

9. The heat radiation structure according to claim 1,
wherein at least a portion of a surface of the first metal member that faces the second metal member is a material including aluminum, and
at least a portion of a surface of the second metal member that faces the first metal member is a material including magnesium.

10. The heat radiation structure according to claim 1, further comprising:
a first electronic member to which heat of the heat source member is transferred; and
a second heat conduction member that is disposed to come into contact with the first electronic member, wherein the second heat conduction member is disposed in a vicinity of the through-hole and comes into contact with the first metal member.

11. The heat radiation structure according to claim 10, wherein at least a portion of a contact surface of the first metal member that comes into contact with the second heat conduction member is a metal.

12. The heat radiation structure according to claim 10, wherein a plurality of second heat conduction members are disposed.

13. The heat radiation structure according to claim 10, wherein the heat source member includes at least a large-scale integrated circuit.

14. The heat radiation structure according to claim 13, wherein the heat source member includes the large-scale integrated circuit, an intermediate substrate, and a semiconductor memory, and the large-scale integrated circuit is laminated on one surface of the intermediate substrate and the semiconductor memory is laminated on the other surface of the intermediate substrate.

15. The heat radiation structure according to claim 14, wherein a thickness of a portion of the second metal member that comes into contact with the first heat conduction member is larger than a thickness of a portion of the second metal member that does not come into contact with the first heat conduction member.

16. The heat radiation structure according to claim 15, wherein the first heat conduction member and the second heat conduction member are gel-like members.

17. The heat radiation structure according to claim 1, further comprising:

a display that is disposed on the first direction side with respect to the second metal member, wherein the first heat conduction member is disposed within an area of the display.

18. The heat radiation structure according to claim 17, wherein at least a portion of the through-hole is disposed within the area of the display.

19. The heat radiation structure according to claim 17, wherein the area of the display is an area of the display when the display is viewed in the first direction in a see-through manner.

* * * * *